US010663992B2

United States Patent
Liu

(10) Patent No.: US 10,663,992 B2
(45) Date of Patent: May 26, 2020

(54) VOLTAGE CONTROL CIRCUIT, METHOD AND DEVICE, AND STORAGE MEDIUM

(71) Applicant: BOE TECHNOLOGY GROUP CO., LTD., Beijing (CN)

(72) Inventor: Jianfu Liu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/453,084

(22) Filed: Jun. 26, 2019

(65) Prior Publication Data

US 2020/0033901 A1     Jan. 30, 2020

(30) Foreign Application Priority Data

Jul. 27, 2018   (CN) ........................ 2018 1 0846110

(51) Int. Cl.
*G05F 1/00*     (2006.01)
*G05F 1/46*     (2006.01)
*H03M 1/12*     (2006.01)

(52) U.S. Cl.
CPC ................ *G05F 1/46* (2013.01); *H03M 1/12* (2013.01)

(58) Field of Classification Search
CPC ..................... G05F 1/46; H03M 1/12
See application file for complete search history.

(56) References Cited

U.S. PATENT DOCUMENTS

2015/0188325 A1* 7/2015 Wagner ................ H02J 7/0085
                                                     307/31

FOREIGN PATENT DOCUMENTS

| CN | 102724740 A | 10/2012 |
|----|-------------|---------|
| CN | 204129648 U | 1/2015 |
| CN | 204304780 U | 4/2015 |
| CN | 105468063 A | 4/2016 |
| CN | 207603496 U | 7/2018 |

OTHER PUBLICATIONS

First Office Action dated Aug. 19, 2019 corresponding to Chinese application No. 201810846110.8.
Office Action dated Feb. 28, 2020 issued in corresponding Chinese Application No. 201810846110.8.

* cited by examiner

*Primary Examiner* — Adolf D Berhane
*Assistant Examiner* — Afework S Demisse
(74) *Attorney, Agent, or Firm* — Nath, Goldberg & Meyer; Joshua B. Goldberg

(57) ABSTRACT

This application provides a voltage control circuit, method and device, and a storage medium. The voltage control circuit includes: a controller and a voltage adjustment circuit both coupled to a power supply terminal for providing a power supply voltage. The controller is configured to: acquire a power supply voltage value at the power supply terminal; determine whether the acquired power supply voltage value deviates from a target power supply voltage value; and determine, in response to the acquired power supply voltage value deviating from the target power supply voltage value, a target control signal associated with the target power supply voltage value; and provide the target control signal to the voltage adjustment circuit. The voltage adjustment circuit is configured to adjust the power supply voltage value at the power supply terminal to the target power supply voltage value according to the target control signal.

15 Claims, 5 Drawing Sheets

VOLTAGE CONTROL CIRCUIT, METHOD AND DEVICE, AND STORAGE MEDIUM

CROSS-REFERENCE TO RELATED APPLICATION

This application claims the benefit of priority to Chinese Patent Application No. 201810846110.8 filed on Jul. 27, 2018, the contents of which are incorporated herein in their entirety by reference.

TECHNICAL FIELD

The present disclosure relates to the field of chip power supply technology, and particularly relates to a voltage control circuit, a voltage control method, a voltage control device and a storage medium.

BACKGROUND

Some existing controller chips, such as FPGA (Field Programmable Gate Array), ARM (Advanced RISC Machines, RISC Microcontroller), CPU (Central Processing Unit), etc., need to be protected in a stable operating state when normally used. However, the power supply voltage received by these controller chips has a great influence on the operating state of the controller chips.

Due to the need for the stable operating state, the above controller chips have high stability requirements for the received power supply voltage (such as the logic supply voltage VDD_LOG or the core supply voltage VDD_CORE).

SUMMARY

In a first aspect, embodiments of the present disclosure provide a voltage control circuit including: a controller and a voltage adjustment circuit, and both the controller and the voltage adjustment circuit are coupled to a power supply terminal for providing a power supply voltage. The controller is configured to: acquire a power supply voltage value at the power supply terminal; determine whether the acquired power supply voltage value deviates from a target power supply voltage value; and determine, in response to the acquired power supply voltage value deviating from the target power supply voltage value, a target control signal associated with the target power supply voltage value; and provide the target control signal to the voltage adjustment circuit. The voltage adjustment circuit is configured to adjust the power supply voltage value at the power supply terminal to the target power supply voltage value according to the target control signal.

In some embodiments, the controller includes a PWM circuit, and the PWM circuit is configured to provide a PWM signal as the target control signal. The controller is configured to determine a target PWM signal associated with the target power supply voltage value based on an association relationship between the power supply voltage value and the PWM signal and to provide the target PWM signal to the voltage adjustment circuit. The voltage adjustment circuit is configured to adjust the power supply voltage value at the power supply terminal to the target power supply voltage value according to the target PWM signal.

In some embodiments, the association relationship between the power supply voltage value and the PWM signal is dependent on the voltage adjustment circuit.

In some embodiments, the power supply terminal is a power supply voltage output terminal of a power supply module external to the voltage control circuit. The voltage adjustment circuit includes: a first resistor, a second resistor, a third resistor, a fourth resistor, a capacitor, a fifth resistor, and a sixth resistor. A first terminal of the first resistor is coupled to the power supply voltage output terminal of the power supply module, and a second terminal of the first resistor is coupled to a feedback voltage output terminal of the power supply module for providing a fixed voltage. A first terminal of the second resistor is coupled to the second terminal of the first resistor, and a second terminal of the second resistor is grounded first terminal of the third resistor is coupled to the second terminal of the first resistor, and a second terminal of the third resistor is coupled to a first terminal of the fourth resistor. A second terminal of the fourth resistor is grounded. A first terminal of the capacitor is coupled to the first terminal of the fourth resistor; and a second terminal of the capacitor is grounded. A first terminal of the fifth resistor is coupled to the first terminal of the fourth resistor, and a second terminal of the fifth resistor is coupled to a control signal output terminal of the controller for outputting the target control signal. A first terminal of the sixth resistor is coupled to the second terminal of the fifth resistor, and a second terminal of the sixth resistor is coupled to a fixed voltage.

In some embodiments; the controller includes an analog to digital converter configured to acquire the power supply voltage at the power supply terminal and convert the acquired power supply voltage from an analog signal to a digital signal.

In some embodiments, the power supply module includes a DC-DC voltage regulator and an inductor coupled between the DC-DC voltage regulator and the power supply terminal.

In some embodiments, the controller is configured to determine whether the acquired power supply voltage value deviates from the target power supply voltage value by determining whether the acquired power supply voltage value is equal to the target power supply voltage value.

In some embodiments, the controller is configured to determine whether the acquired power supply voltage value deviates from the target power supply voltage value by determining whether a difference between the acquired power supply voltage value and the target power supply voltage value is within a threshold range.

In a second aspect, the embodiments of the present disclosure provide a voltage control method, including: acquiring, by a controller, a power supply voltage value at a power supply terminal; determining, by the controller, whether the acquired power supply voltage value deviates from a target power supply voltage value; in response to the acquired power supply voltage value deviating from the target power supply voltage value, determining, by the controller, a target control signal associated with the target power supply voltage value; providing, by the controller, the target control signal to a voltage adjustment circuit; and adjusting, by the voltage adjustment circuit, the power supply voltage value at the power supply terminal to the target power supply voltage value according to the target control signal.

In some embodiments, the target control signal is a PWM signal. Determining the target control signal associated with the target power supply voltage value includes: determining a target PWM signal associated with the target power supply voltage value according to an association relationship between the power supply voltage value and the PWM signal.

In some embodiments, the voltage control method further includes determining the association relationship between the power supply voltage value and the PWM signal based on the voltage adjustment circuit.

In some embodiments, determining the association relationship between the power supply voltage value and the PWM signal based on the voltage adjustment circuit includes determining an association relationship between the power supply voltage value and a PWM-signal duty cycle based on the voltage adjustment circuit. Determining the target PWM signal associated with the target power supply voltage value according to the association relationship between the power supply voltage value and the PWM signal includes: determining a target PWM-signal duty cycle associated with the target power supply voltage value according to the determined association relationship between the power supply voltage value and the PWM-signal duty cycle; and generating the target PWM signal based on the target PWM-signal duty cycle.

In some embodiments, determining whether the acquired power supply voltage value deviates from the target power supply voltage value includes determining whether the acquired power supply voltage value is equal to the target power supply voltage value.

In some embodiments, determining whether the acquired power supply voltage value deviates from the target power supply voltage value includes determining whether a difference between the acquired power supply voltage value and the target power supply voltage value is within a threshold range.

In a third aspect, embodiments of the present disclosure provide a voltage control device, including: a voltage acquisition module configured to acquire a current power supply voltage value through an analog-to-digital converter; a target signal determination module configured to determine whether the current power supply voltage value deviates from a target power supply voltage value, and determine, in a case where the current power supply voltage value deviates from the target power supply voltage value, a target control signal associated with the target power supply voltage value; and the voltage adjustment module configured to control a voltage adjustment circuit to adjust the current power supply voltage to the target power supply voltage value by using the target control signal.

In a fourth aspect, embodiments of the present disclosure provide a computer readable storage medium, in which a computer program is stored, and when the computer program is executed, the method according to the second aspect of the present disclosure is implemented.

BRIEF DESCRIPTION OF THE DRAWINGS

The above and/or additional aspects and advantages of the present disclosure will become apparent and readily understood from the following embodiments described in conjunction with the accompanying drawings, in which.

DETAILED DESCRIPTION

Figure 1:
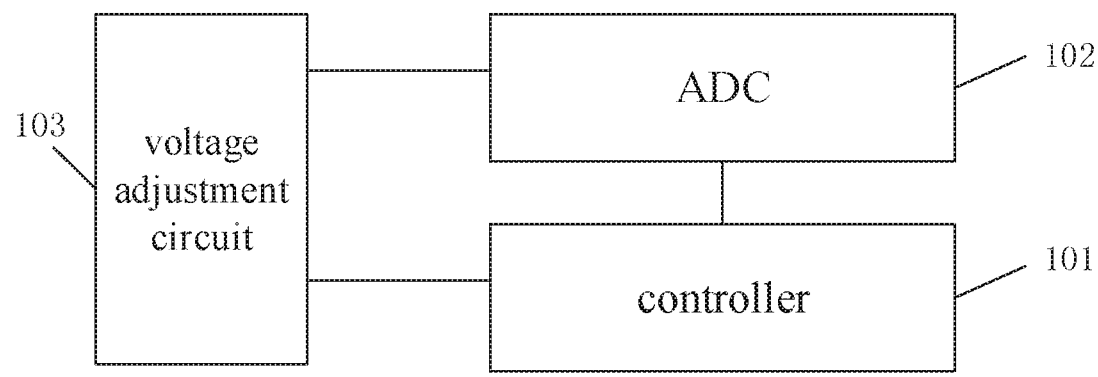
FIG. 1 is a block diagram of a voltage control circuit according to an embodiment of the present disclosure.

The present disclosure is described in detail below, and examples of embodiments of the present disclosure are illustrated in the accompanying drawings, in which the same or similar reference numerals refer to the same or similar components or components having the same or similar functions throughout. Further, if a detailed description of a known technique is unnecessary for the features of the present disclosure shown, it will be omitted. The embodiments described below with reference to the accompanying drawings are intended to be illustrative and only used to explain the present disclosure, and are not to be construed as limiting the present disclosure.

Those skilled in the art will appreciate that all terms (including technical and scientific terms) used herein have the same meaning as commonly understood by one of ordinary skill in the art to which this disclosure belongs, unless otherwise defined. It should also be understood that terms, such as those defined in commonly used dictionaries, should be interpreted as having a meaning that is consistent with their meaning in the context of the relevant art and will not be interpreted in an idealized or overly formal sense unless expressly so defined herein.

Those skilled in the art will appreciate that, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected to" or "coupled to" another element, t can be directly connected or coupled to the other element or intervening elements may be present. Further, "connected" or "coupled" as used herein may include either a wireless connection or a wireless coupling. The phrase "and/or" used herein includes all or any one and all combinations of one or more of the associated listed items.

At present, a general DC-DC (Direct Current-Direct Current) chip is commonly used to supply power to a controller chip. Inventors have found that in actual use, a power supply voltage from the general DC-DC chip may change due to external signal interference or internal load change, resulting in an unstable power supply voltage, which may further cause a controller chip receiving the power supply voltage to work in an unstable state.

The technical solutions of the present disclosure and how the technical solutions of the present disclosure can solve the above technical problems are described in detail in the following specific embodiments. The following specific embodiments may be combined with each other, and the same or similar concepts or processes may not be described in some embodiments. The embodiments of the present disclosure will be described below with reference to the accompanying drawings.

The embodiments of the present disclosure provide a voltage control circuit. As shown in FIG. 1, the voltage control circuit includes a controller 101, an analog to digital converter (ADC) 102, and a voltage adjustment circuit 103. The ADC 102 and the voltage adjustment circuit 103 are both electrically coupled to the controller 101. The controller 101 and the voltage adjustment circuit 103 are both coupled to a power supply terminal for supplying a power supply voltage, for example, electrically coupled to a power supply voltage output terminal of a power supply module external to the controller 101 (the connection is not shown in FIG. 1).

The controller 101 is configured to acquire a current power supply voltage value through the ADC 102, determine whether the current power supply voltage value deviates from a target power supply voltage value, determine, in response to the current power supply voltage value deviating from the target power supply voltage value, a target control signal associated with the target power supply voltage value, and provide the target control signal to the voltage adjustment circuit 103. The voltage adjustment circuit 103 adjusts the current power supply voltage value to the target power supply voltage value according to the target control signal.

In some embodiments, the controller 101 may be one of a CPU, an ARM and an FPGA. The target power supply voltage value may be provided in the controller 101 in advance.

The operating principle of the voltage control circuit according to the embodiments of the present disclosure will be detailed in the following method embodiments, and will not be described here.

The above voltage control circuit according to the embodiments of the present disclosure can achieve at least the following beneficial effects.

1) By acquiring the current power supply voltage value and detecting the deviation of the current power supply voltage value from the target power supply voltage value, it is possible to determine whether the power supply voltage is fluctuating; when determining that the power supply voltage is fluctuating, the fluctuation of the power supply voltage can be reduced by automatically adjusting the power supply voltage; so that the power supply voltage is kept stable, and the operating state of a load chip receiving the stable power supply voltage is also stabilized, thereby improving the reliability of the product.

2) When the power supply voltage fluctuates, the control signal for the power supply voltage can be adjusted so that the control signal for the power supply voltage maintains at a stable value. Based on the stable control signal, the power supply voltage can be automatically adjusted so that the power supply voltage maintains at a stable value, thereby improving the stability of the load chip.

3) The voltage control circuit is applicable to a general DC-DC chip, which eliminates the need for a special and expensive power management chip, thereby overcoming the limitation of the power management chip while enhancing versatility.

Figure 2:
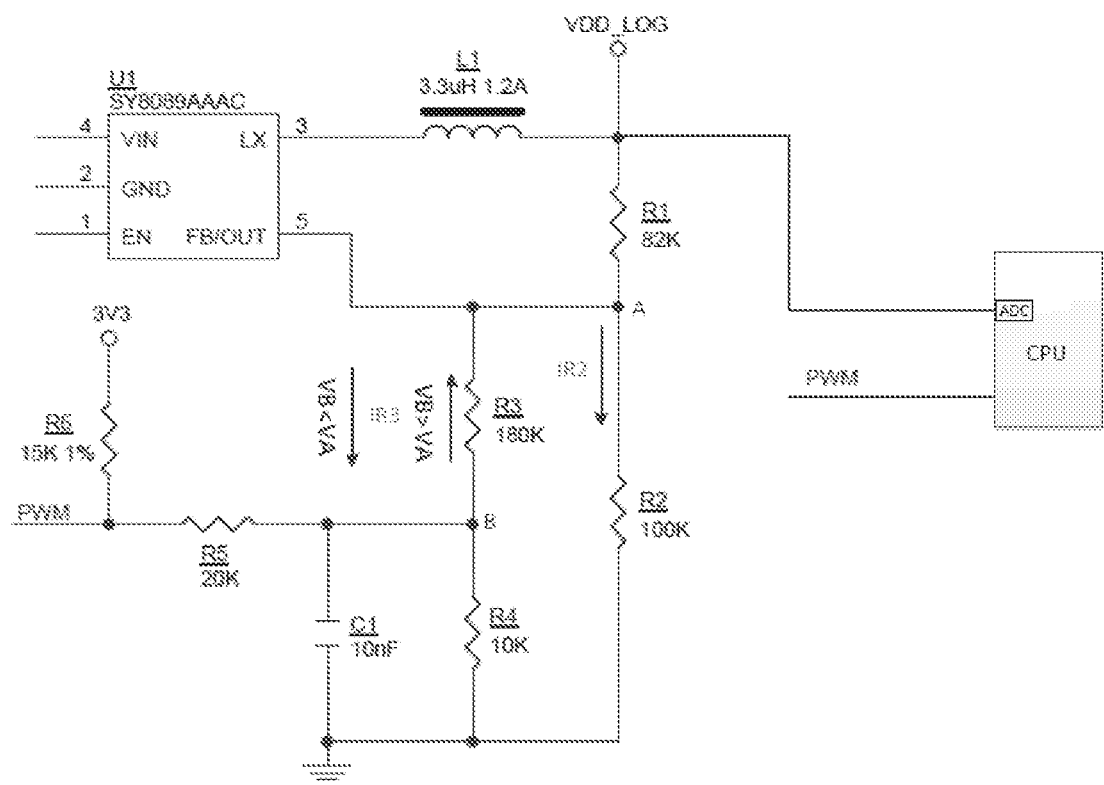
FIG. 2 is a schematic diagram illustrating a circuit configuration of a voltage control circuit according to an embodiment of the present disclosure and connection between the voltage control circuit and a power supply module.

FIG. 2 is a schematic diagram illustrating a circuit configuration of a voltage control circuit according to an embodiment of the present disclosure and connection between the voltage control circuit and a power supply module. As shown in FIG. 2, the ADC 102 is also disposed in the controller 101; and the controller 101 is configured to control the ADC 102 to convert the acquired current power supply voltage from an analog signal to a digital signal. The ADC is disposed in the controller 101 to increase the integration of the circuit and save space.

In some embodiments, the controller 101 includes a PWM (Pulse Width Modulation) circuit, which may output the target control signal in the form of a PWM signal.

In some embodiments, the controller 101 is configured to: determine, according to a predetermined association relationship between the power supply voltage value and the PWM signal, a target PWM signal associated with the target power supply voltage; and provide the target PWM signal to the voltage adjustment circuit 103. The voltage adjustment circuit 103 adjusts the power supply voltage value to the target power supply voltage value according to the target PWM In some embodiments, the association relationship between the power supply voltage value and the PWM signal may be determined based on the voltage adjustment circuit 103. The specific determination method will be detailed in the following method embodiments, and will not be described here. Based on the PWM technology, the association relationship between the power supply voltage value and the PWM signal is determined, which facilitates effective adjustment of the power supply voltage, and keeps the power supply voltage stable. In addition, the adjustment method based on PWM technology is simpler, more flexible, and has better dynamic response.

In some embodiments, as shown in FIG. 2, the voltage adjustment circuit 103 includes: a first resistor R1, a second resistor R2, a third resistor R3, a fourth resistor R4, a capacitor CS1, a fifth resistor R5, and a sixth resistor R6.

A first terminal of the first resistor R1 is electrically coupled to the power supply voltage output terminal of the power supply module, and a second terminal of the first resistor R1 is electrically coupled to a feedback voltage output terminal of the power supply module, and the first terminal of the first resistor is also electrically coupled to the ADC 102. A first terminal of the second resistor R2 is electrically coupled to the second terminal of the first resistor R1, and a second terminal of the second resistor R2 is grounded, A first terminal of the third resistor R3 is electrically coupled to the second terminal of the first resistor R1, and a second terminal of the third resistor R3 is electrically coupled to a first terminal of the fourth resistor R4. A second terminal of the fourth resistor R4 is grounded. A first terminal of the capacitor C1 is electrically coupled to the first terminal of the fourth resistor R4, and a second terminal of the capacitor C2 is grounded. A first terminal of the fifth resistor R5 is electrically coupled to the first terminal of the fourth resistor R4, and a second terminal of the fifth resistor R5 is electrically coupled to a control signal output terminal of the controller 101 for outputting the target control signal. A first terminal of the sixth resistor R6 is electrically coupled to the second terminal of the fifth resistor R5, and a second terminal of the sixth resistor R6 is coupled to a fixed voltage, which may be an amplitude voltage (e.g., 3.3V) of the PWM signal.

As shown in FIG. 2, the power supply module in the embodiment of the present disclosure includes a DC-DC voltage regulator U1 and an inductor L1. The DC-DC voltage regulator U1 transmits power to a load through the inductor L1. An LX terminal of the DC-DC voltage regulator U1 is electrically coupled to a first terminal of the inductor L1, and a second terminal of the inductor L1, as the power supply voltage output terminal of the power supply module, is electrically, coupled to the first terminal of the first resistor R1, and a FB/OUT terminal of the DC-DC voltage regulator U1, as the feedback voltage output terminal of the power supply module, is electrically coupled to the second terminal of the first resistor R1. As the DC-DC voltage regulator U1, a variety of models of chips may be used, for example, a chip of the model of SY8089AAAC as shown in FIG. 2.

In the embodiment of the present disclosure, as shown in FIG. 2, a magnitude of a current flowing through the first resistor R1 can directly affect a magnitude of the power supply voltage VDD_LOG, and by adjusting a value of the current flowing through the first resistor R1, the power supply voltage VDD_LOG can be adjusted. The fifth resistor R5 and the capacitor C1 form an RC (Resistance-Capacitance) charge-discharge circuit, the PWM signal received by the fifth resistor R5 is subjected to the charge-discharge process by the RC charge-discharge circuit, and thus a pulse signal can be converted into a stable voltage signal.

The parameters regarding the first resistor R1, the second resistor R2, the third resistor R3, the fourth resistor R4, the fifth resistor R5, the sixth resistor R6, the capacitor C1, and the inductor L1 in the embodiment of the present disclosure may be set or selected according to actual needs. Different parameters can result in different association relationship relationships between the power supply voltage value and the PWM signal, so as to meet the needs of different users.

As shown in FIG. 2, the resistance values of the first resistor R1, the second resistor R2, the third resistor R3, the fourth resistor R4, and the fifth resistor R5 are 82 KΩ (kilo-ohm), 100 KΩ, 180KΩ, 101 KΩ, and 20 KΩ, respectively; the sixth resistor R6 may be a resistor having a resistance value of 15KΩ and an error accuracy of 1%; the capacitor C1 may be a capacitor having a capacitance of 10 nF (nanofarad); and the inductor L1 may be an inductor having an inductance of 3.3 µH (microhenry) and a rated current of 1.2 A (ampere).

The operating principle of the voltage control circuit according to the embodiments of the present disclosure will be detailed in the following method embodiments, and will not be described here.

The above voltage control circuit according to the embodiments of the present disclosure can achieve at least the following beneficial effects.

1) Based on the PWM technology, by determining the association relationship between the power supply voltage value and the PWM signal, the target PWM signal associated with the target power supply voltage value is determined, and then the power supply voltage can be automatically adjusted based on the target PWM signal, which facilitates effective adjustment of the power supply voltage, and keeps the power supply voltage stable in addition, the adjustment method based on PWM technology is simpler, more flexible, and has better dynamic response.

2) Based on the circuit principle of the voltage adjustment circuit 103 according to the embodiment, the association relationship between the power supply voltage value and the PWM signal can be determined; and by adjusting the parameters regarding the resistors and capacitors in the voltage adjustment circuit 103, a new association relationship between the power supply voltage value and the PWM signal can be established to meet the needs of different users.

Figure 3:
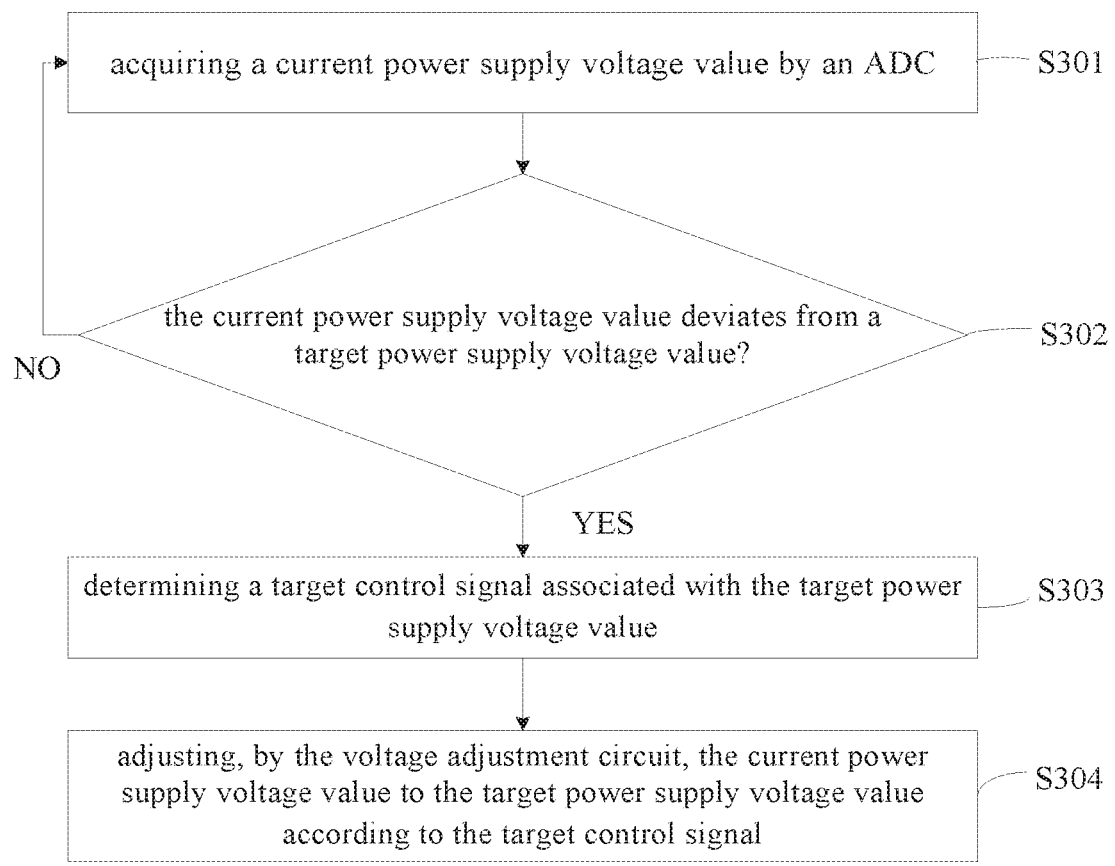
FIG. 3 is a flow chart of a voltage control method according to an embodiment of the present disclosure.

Based on the same inventive concept, the embodiments of the present disclosure further provide a voltage control method. The flow chart of the method is shown in FIG. 3, and the method includes steps S301 to S304.

In step S301, a current power supply voltage value is acquired by an analog to digital converter (ADC) 102.

In an embodiment, the ADC 102 acquires the current power supply voltage and converts the current power supply voltage from an analog signal to a digital signal.

In step S302, it is determined whether the current power supply voltage value deviates from a target power supply voltage value. If it is determined that the current power supply voltage value deviates from the target power supply voltage value, step S303 is performed, otherwise step S301 is performed.

By comparing and judging the power supply voltage value, it may be determined whether the power supply voltage fluctuates, so as to determine whether the power supply voltage needs to be automatically adjusted. If it is determined that the power supply voltage fluctuates according to the deviation of the power supply voltage value, the power supply voltage needs to be automatically adjusted to keep the power supply voltage stable.

In step S303, a target control signal associated with the target power supply voltage value is determined.

In some embodiments, the target control signal is a PWM signal.

In some embodiments, the association relationship between the power supply voltage value and the PWM signal is determined according to the voltage adjustment circuit 103; and a target PWM signal associated with the target power supply voltage value is determined according to the determined association relationship between the power supply voltage value and the PWM It should be noted that determining the association relationship between the power supply voltage value and the PWM signal according to the voltage adjustment circuit 103 may be performed in this step, or may be performed before this step.

In step S304, the voltage adjustment circuit 103 adjusts the current power supply voltage value to the target power supply voltage value according to the target control signal.

In some embodiments, the voltage adjustment circuit 103 adjusts the power supply voltage value from the current power supply voltage value to the target power supply voltage value based on the target PWM signal.

By adjusting the current power supply voltage value in the above manner, the power supply voltage of the chip can be stabilized at the target power supply voltage value, so that the operating state of the chip can be stabilized, and the probability of abnormal operating conditions is greatly reduced.

The above voltage control method according to the embodiment of the present disclosure can achieve at least the following beneficial effects.

1) By acquiring the current power supply voltage value and detecting the deviation of the current power supply voltage value from the target power supply voltage value, it is possible to determine whether the power supply voltage is fluctuating; when determining that the power supply voltage is fluctuating, the fluctuation of the power supply voltage can be reduced by automatically adjusting the power supply voltage, so that the power supply voltage is kept stable, and the operating state of a load chip receiving the stable power supply voltage is also stabilized, thereby improving the reliability of the product.

2) When the power supply voltage fluctuates, the control signal for the power supply voltage can be adjusted so that the control signal for the power supply voltage maintains at a stable value. Based on the stable control signal, the power supply voltage can be automatically adjusted so that the power supply voltage maintains at a stable value, thereby improving the stability of the load chip.

3) The voltage control method is applicable to a general DC-DC chip, which eliminates the need for a special and expensive power management chip, thereby overcoming the limitation of the power management chip while enhancing versatility.

4) Based on the PWM technology, by determining the association relationship between the power supply voltage value and the PWM signal, the target PWM signal associated with the target power supply voltage value is determined, and then the power supply voltage can be automatically adjusted based on the target PWM signal, which facilitates effective adjustment of the power supply voltage, and keeps the power supply voltage stable. In addition, the adjustment method based on PWM technology is simpler, more flexible, and has better dynamic response.

5) Based on the voltage adjustment circuit 103 according to the embodiment, the association relationship between the power supply voltage value and the PWM signal can be determined; and by adjusting the parameters regarding the resistors and capacitors in the voltage adjustment circuit 103, a new association relationship between the power supply voltage value and the PWM signal can be established to meet the needs of different users.

Figure 4:
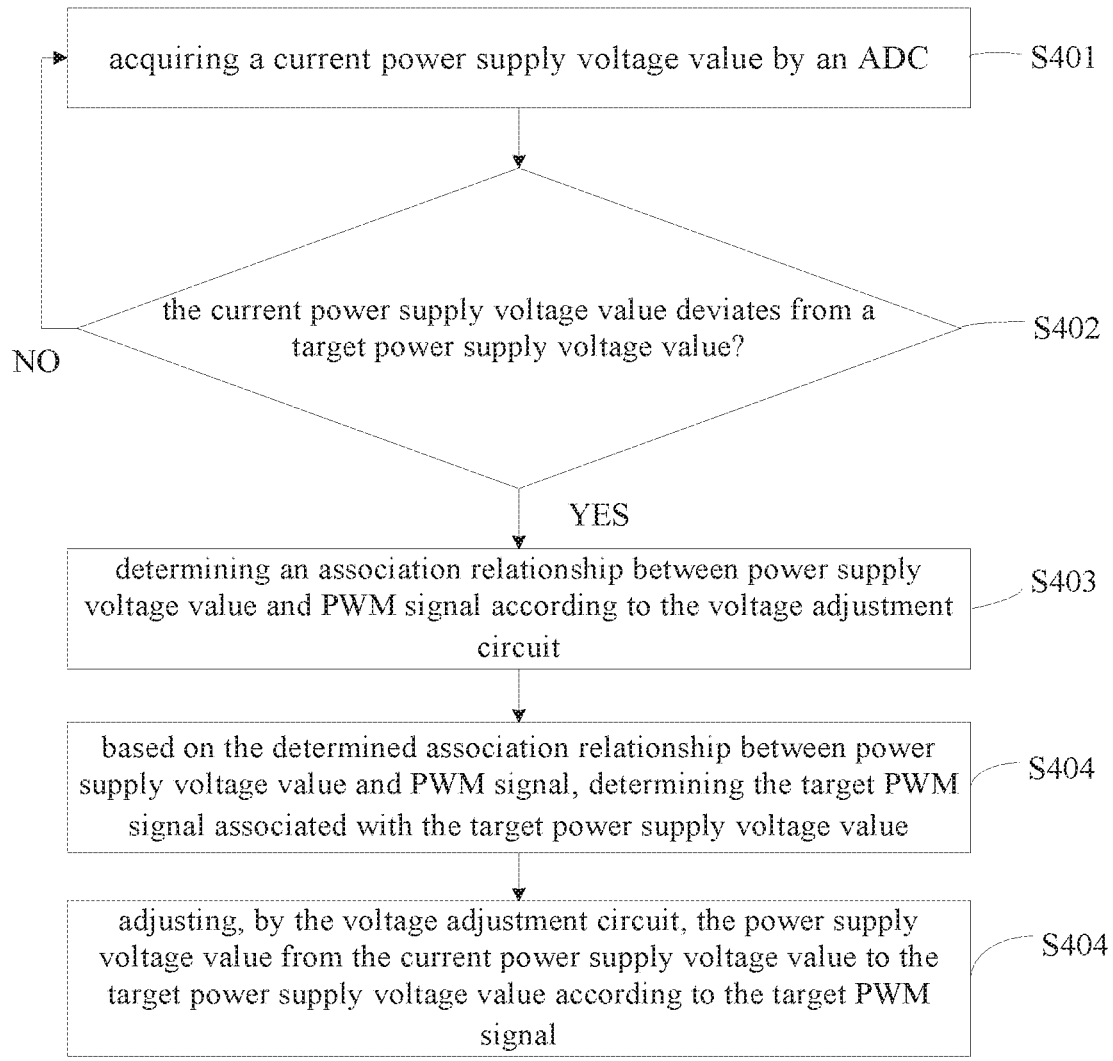
FIG. 4 is flow chart of a voltage control method according to an embodiment of the present disclosure.

FIG. 4 is flow chart of a voltage control method according to an embodiment of the present disclosure. As shown in FIG. 4, the voltage control method includes steps S401 to S405.

In step S401, a current power supply voltage value is acquired by an analog to digital converter.

In step S402, it is determined whether the current power supply voltage value deviates from the target power supply voltage value. If it is determined that the current power supply voltage value deviates from the target power supply voltage value, step S403 is performed, otherwise step S401 is performed.

In some embodiments, it is determined whether the current power supply voltage value is equal to the target power supply voltage value. If it is determined that the current power supply voltage value is equal to the target power supply voltage value, it is determined that the current power supply voltage value is not deviated from the target power supply voltage value, otherwise it is determined that the current power supply voltage value deviates from the target power supply voltage value.

In some embodiments, a difference between the current power supply voltage value and the target power supply voltage value is determined; then, it is determined whether the difference exceeds a difference threshold; and if it is determined that the difference exceeds the difference threshold, it is determined that the current power supply voltage value deviates the target power supply voltage value, otherwise it is determined that the current power supply voltage value is not deviated from the target power supply voltage value. The difference threshold can be set according to actual needs.

In step S403, an association relationship between the power supply voltage value and the PWM signal is determined according to the voltage adjustment circuit.

In some embodiments, an association relationship between the power supply voltage value and the duty cycle of the PWM signal is determined according to the voltage adjustment circuit.

The association relationship between the power supply voltage value and the duty cycle of the PWM signal can be determined according to the structure of the voltage adjustment circuit 103. How to determine the association relationship between the power supply voltage value and the duty cycle of the PWM signal will be described below in connection with the voltage adjustment circuit 103 shown in FIG. 2.

Figure 5:
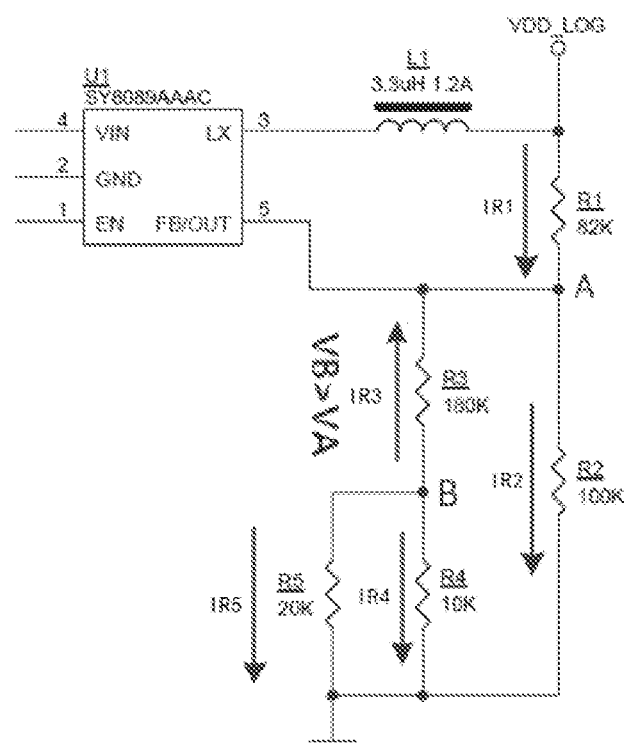
FIG. 5 is an equivalent circuit diagram of a voltage adjustment circuit in an embodiment of the present disclosure in a case where a PWM signal having a duty cycle of 0% is received.

When the duty cycle of the PWM signal is 0%, the PWM signal received by the voltage adjustment circuit 103 shown in FIG. 2 is at 0 V (volt), and the equivalent circuit diagram of the voltage adjustment circuit 103 is as shown in FIG. 5. In the circuit shown in FIG. 5, between point A and the ground, the fourth resistor R4 is connected in parallel with the fifth resistor R5 and then connected in series with the third resistor R3, and the series structure is connected in parallel with the second resistor R2. Thus, an equivalent resistance $R_{AG}$ between point A and the ground can be calculated according to the following Expression (1):

$$R_{AG}=(R4//R5+R3)//R2 \quad \text{Expression (1)}$$

The operation symbol "//" indicates calculation of a total resistance of a resistor before the symbol and a resistor after the symbol connected in parallel. For example, $R4//R5=R4 \times R5/(R4+R5)$.

After the resistance values of the second resistor R2, the third resistor R3, the fourth resistor R4 and the fifth resistor R5 shown in FIG. 5 are substituted into Expression (1), a value of the equivalent resistance $R_{AG}$ can be calculated as 65.116 KΩ(kilo-ohm).

The voltage VA at point A is equal to the fixed voltage VFB output from the FB/OUT terminal of chip U1, and according to the inherent characteristic of the chip U1 shown in FIG. 5, the following can be obtained: VA=VFB=0.6V. As shown in FIG. 5, an equivalent resistor between point A and the ground is connected in series with R1. Thus, the power supply voltage VDD_LOG in a case where the duty cycle of the PWM signal is 0% can be calculated according to the following expression:

$$VDD\_LOG=VA/R_{AG} \times (R_{AG}+R1) \quad \text{Expression (2)}$$

By substituting voltage values or resistance values of VA, $R_{AG}$ and R1 shown in FIG. 5 into Expression (2), the power supply voltage VDD_LOG associated with the PWM signal having a duty cycle of 0% is 1.36V, that is, the upper limit value of the power supply voltage VDD_LOG.

Figure 6:
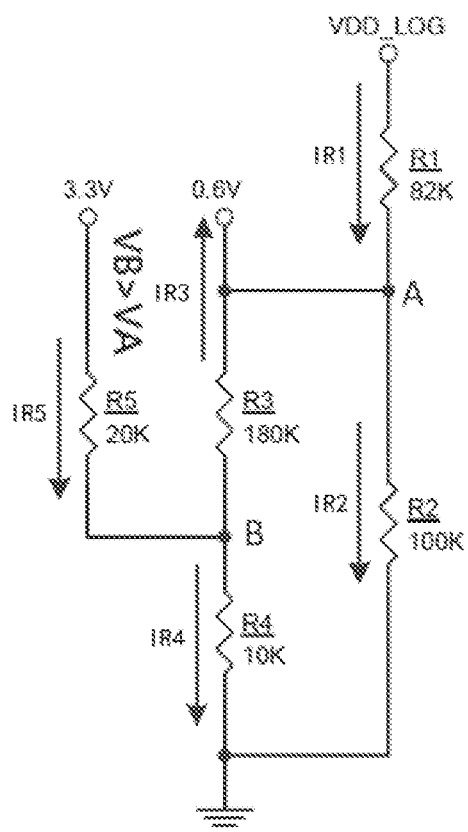
FIG. 6 is an equivalent circuit diagram of a voltage adjustment circuit in an embodiment of the present disclosure in a case where a PWM signal having a duty cycle of 100% is received.

In a case where the duty cycle of the PWM signal is 100%, the PWM signal received by the voltage adjustment circuit 103 shown in FIG. 2 is at 3.3V, and in this case, an equivalent circuit of the voltage adjustment circuit 103 is as shown in FIG. 6. In FIG. 6, IR1, IR2, IR3, IR4, and IR5 represent values of the currents flowing through the resistors R1, R2, R3, R4, and R5, respectively. When the voltage VB at point B is greater than VA, the current flow in the circuit is as shown by arrows in FIG. 6; when VB is smaller than VA, the current flow through IR3 may refer to FIG. 2.

According to Kirchhoff's current law, the values of the currents shown in FIG. 6 have the following relationships: IR1+IR3=IR2, IR3+IR4=IR5. Further, the relationships can be expressed by Expressions (3) and (4), respectively, and the value of the power supply voltage VDD_LOG in the case where the duty cycle of the PWM signal is 100% can be calculated according to Expression (5).

$$IR1 \pm (VB-VA)/R3=VA/R2 \quad \text{Expression (3)}$$

$$(VB-VA)/R3+VB/R4=(3.3-VB)/R5 \quad \text{Expression (4)}$$

$$VDD\_LOG=VFB+IR1 \times R1 \quad \text{Expression (5)}$$

By substituting relevant values into Expression (4), it can be obtained that VB=1.0821 V; by substituting the value of VB and other relevant values into Expression (3), it can be obtained that IR1=0.003321 A; by substituting the value of IR1 and other relevant values into Expression (5), it can be obtained that the power supply voltage VDD_LOG associated with the PWM signal having a duty cycle of 100% is 0.8723V, that is, the lower limit value of the power supply voltage VDD_LOG.

By calculation for two critical conditions in which the PWM signals have duty cycles of 0% and 100%, respectively, the power supply voltage values associated with two PWM signals respectively having duty cycles of 0% and 100% can be determined, so that an adjustable range (e.g., 0.8723V~1.36V) of the power supply voltage VDD_LOG can be determined.

By taking a case where the PWM signal has a duty cycle of 50% as an example, the following description will be given on how to determine the association relationship between the duty cycle of the PWM signal and the power supply voltage value in a case where the duty cycle of the PWM signal has an intermediate value (a value in a range from 0% to 100%, excluding 0% and 100%). The case of other intermediate value is similar.

In a case where the duty cycle of the PWM signal is 50%, an equivalent circuit of the voltage adjustment circuit 103 shown in FIG. 2 is also shown in FIG. 6, the current IR5 flowing through the fifth resistor R5 satisfies: IR5=(3.3−VB)×50%, then Expression (4) can be evolved into Expression (6), and the calculation of the values of remaining currents and the expressions are the same as those in the case where the duty cycle of the PWM signal is 100%.

$$(VB-VA)/R3+VB/R4=(3.3-VB)\times 0.5/R5 \quad \text{Expression (6)}$$

By substituting relevant values into Expression (6), it can be obtained that VB=0.6574468 V; by substituting the value of VB and other relevant values into Expression (3), it can be obtained that IR1=0.005561 A; by substituting the value of IR1 and other relevant values into Expression (5), it can be obtained that the power supply voltage VDD_LOG associated with the PWM signal having a duty cycle of 50% is 1.056V.

Step S403 may be performed after step S402 (as shown in FIG. 4), or may be performed at any time before step S402, or may be performed simultaneously with step S402.

Further, step S403 may be performed once or may be performed multiple times. In a case where the structure of the voltage adjustment circuit 103 and the parameters regarding the components therein are unchanged; after determining the association relationship between the power supply voltage value and the duty cycle of the PWM signal in step S403, the association relationship may be directly used in the subsequent step, that is, step S404 may be directly performed without step S403; in a case where the structure of the voltage adjustment circuit 103 or the parameters regarding the components therein is changed, step S403 needs to be performed again to determine a new association relationship between the power supply voltage value and the duty cycle of the PWM signal when the voltage control method is executed for the first time after the change.

In step S404, based on the determined association relationship between the power supply voltage value and the PWM signal, the target PWM signal associated with the target power supply voltage value is determined.

In some embodiments, according to the determined association relationship between the power supply voltage value and the duty cycle of the PWM signal, the target duty cycle of the PWM signal associated with the target power supply voltage value is determined, and the target PWM signal is generated based on the target duty cycle of the PWM signal.

For example; when the target power supply voltage value is 1.056V, it may be determined that the target duty cycle of the PWM signal associated with the target power supply voltage value is 50% according to the determined association relationship between the power supply voltage value and the duty cycle of the PWM signal, thereby generating a PWM signal having a duty cycle of 50% as the target PWM signal.

In step S405, the voltage adjustment circuit adjusts the power supply voltage value from the current power supply voltage value to the target power supply voltage value according to the target PWM signal.

In some embodiments, when the voltage adjustment circuit 103 receives the target PWM signal output from the controller 101, the resistors and capacitors in the voltage adjustment circuit 103 may respond to the target PWM signal, thereby outputting a power supply voltage having the target power supply voltage value via the first terminal of the first resistor R1.

The power supply voltage output by the voltage adjustment circuit 103 may be transmitted to the controller 101 via the ADC 102, and the controller 101 continues to control the power supply voltage by steps S401~S405, and thus can achieve continuous automatic adjustment of the power supply voltage.

The voltage control method according to the embodiment of the present disclosure can achieve at least the following beneficial effects.

1) Based on the PWM technology, by determining the association relationship between the power supply voltage value and the PWM signal, the target PWM signal associated with the target power supply voltage value is determined, and then the power supply voltage can be automatically adjusted based on the target PWM signal, which facilitates effective adjustment of the power supply voltage; and keeps the power supply voltage stable. In addition, the adjustment method based on PWM technology is simpler; more flexible, and has better dynamic response.

2) Based on the circuit configuration of the voltage adjustment circuit according to the embodiment, the association relationship between the power supply voltage value and the PWM signal can be determined; and by adjusting the parameters regarding the resistors and capacitors in the voltage adjustment circuit 103, a new association relationship between the power supply voltage value and the PWM signal can be established to meet the needs of different users.

3) By determining the association relationship between the power supply voltage value and the duty cycle of the PWM signal, the duty cycle of the PWM signal can be automatically adjusted, and thus, the PWM signal can be precisely adjusted and maintained at a stable value.

Figure 7:
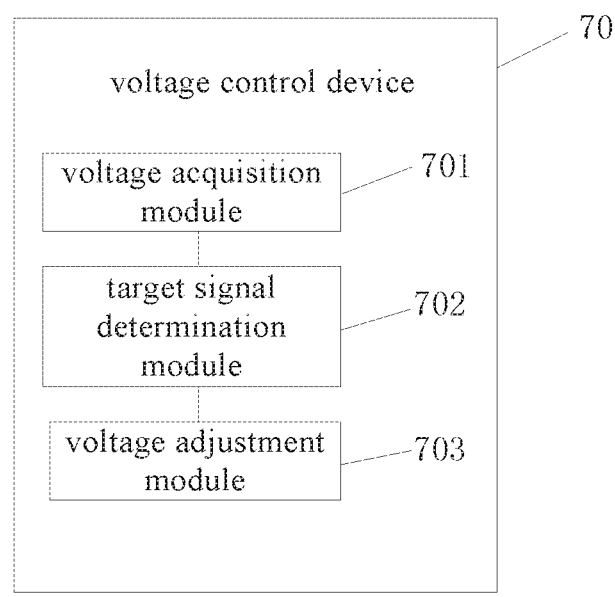
FIG. 7 is a block diagram of a voltage control device according to an embodiment of the present application.

The embodiments of the present disclosure further provide a voltage control device, and a block diagram of the voltage control device is shown in FIG. 7. The voltage control device includes a voltage acquisition module 701, a target signal determination module 702, and a voltage adjustment module 703.

The voltage acquisition module 701 is configured to acquire a current power supply voltage value through the ADC 102.

The target signal determination module 702 is configured to determine whether the current power supply voltage value acquired by the voltage acquisition module 701 deviates from a target power supply voltage value; and determine a target control signal associated with the target power supply voltage value if the current power supply voltage value deviates from the target power supply voltage value.

The voltage adjustment module 703 is configured to control the voltage adjustment circuit 103 to adjust the current power supply voltage value to the target power supply voltage value according to the target control signal determined by the target signal determination module 702.

In some embodiments, the voltage acquisition module 701 is configured to control the ADC 102 to acquire a current power supply voltage and convert the current power supply voltage from an analog signal to a digital signal.

In some embodiments, the target control signal is a PWM signal, and the target signal determination module 702 is configured to determine whether the current power supply voltage value deviates from the target power supply voltage value; and determine a target PWM signal associated with the target power supply voltage value if the current power supply voltage value deviates from the target power supply voltage value.

In some embodiments, the voltage adjustment module 703 is configured to control the voltage adjustment circuit 103 to adjust the power supply voltage value from the current power supply voltage value to the target power supply voltage value according to the target PWM signal.

The voltage control device 70 of the present embodiment can perform the voltage control method provided by the embodiment of the present disclosure, and the implementation principle and the beneficial effects thereof are similar, and details thereof are not described herein again.

The embodiments of the present disclosure further provide a computer readable storage medium, on which a computer program is stored, and when the computer program is executed by the controller 101, the voltage control method according to the embodiment of the present disclosure is implemented.

The computer readable medium includes, but is not limited to, any type of disk (including floppy disk, hard disk, optical disk, CD-ROM, and magneto-optical disk), ROM (Read-Only Memory), RAM (Random Access Memory), EPROM (Erasable Programmable Read-Only Memory), EEPROM (Electrically Erasable Programmable Read Only Memory), flash memory, magnetic card or light card. That is, the readable medium includes any medium that stores or transmits information in a device (e.g., computer) readable manner.

The computer readable storage medium provided by the embodiment of the present disclosure has the same inventive concept and the same beneficial effects as the foregoing embodiments, and details thereof are not described herein again.

Those skilled in the art can understand that the steps, measures, and solutions in the various operations, methods, and processes that have been discussed in the present disclosure may be alternated, changed, combined, or deleted. Further, other steps, measures, and solutions in the various operations, methods, and processes that have been discussed in present disclosure can also be alternated, modified, rearranged, decomposed, combined, or deleted. Further, steps, measures, and solutions in the prior art in the various operations, methods, and processes that have been disclosed in present disclosure can also be alternated, modified, rearranged, decomposed, combined, or deleted.

It should be understood that although the various steps in the flow charts of the drawings are sequentially displayed as indicated by the arrows, these steps are not necessarily performed in the order indicated by the arrows. Unless explicitly stated herein, these steps are not strictly limited in the execution order, and may be performed in other sequences. Moreover, at least part of the steps in the flow charts of the drawings may include a plurality of sub-steps or stages, which are not necessarily performed at the same time, but may be performed at different times, and the plurality of sub-steps or stages are not necessarily performed sequentially, but may be performed alternately with other steps or at least part of sub-steps or stages of other steps.

The above describes only part of the embodiments of the present disclosure should be noted that those skilled in the art can also make some improvements and modifications without departing from the principle of the present disclosure, and these improvements and modifications should also be regarded as failing into the scope of the present disclosure.

The invention claimed is:

1. A voltage control circuit comprising: a controller and a voltage adjustment circuit both coupled to a power supply terminal for providing a power supply voltage,
   wherein the controller is configured to:
   acquire a power supply voltage value at the power supply terminal;
   determine whether the acquired power supply voltage value deviates from a target power supply voltage value;
   determine, in response to the acquired power supply voltage value deviating from the target power supply voltage value, a target control signal associated with the target power supply voltage value; and
   provide the target control signal to the voltage adjustment circuit, and
   the voltage adjustment circuit is configured to adjust the power supply voltage value at the power supply terminal to the target power supply voltage value according to the target control signal.

2. The voltage control circuit of claim 1, wherein the controller comprises a PWM circuit configured to provide a PWM signal as the target control signal;
   the controller is configured to determine a target PWM signal associated with the target power supply voltage value based on an association relationship between the power supply voltage value and the PWM signal and to provide the target PWM signal to the voltage adjustment circuit; and
   the voltage adjustment circuit is configured to adjust the power supply voltage value at the power supply terminal to the target power supply voltage value according to the target PWM signal.

3. The voltage control circuit of claim 2, wherein the association relationship between the power supply voltage value and the PWM signal is dependent on the voltage adjustment circuit.

4. The voltage control circuit of claim 1, wherein
   the power supply terminal is a power supply voltage output terminal of a power supply module external to the voltage control circuit;
   the voltage adjustment circuit comprises: a first resistor, a second resistor, a third resistor, a fourth resistor, a capacitor, a fifth resistor, and a sixth resistor;
   a first terminal of the first resistor is coupled to the power supply voltage output terminal of the power supply module, and a second terminal of the first resistor is coupled to a feedback voltage output terminal of the power supply module for providing a fixed voltage;
   a first terminal of the second resistor is coupled to the second terminal of the first resistor, and a second terminal of the second resistor is grounded;
   a first terminal of the third resistor is coupled to the second terminal of the first resistor, and a second terminal of the third resistor is coupled to a first terminal of the fourth resistor;

a second terminal of the fourth resistor is grounded;

a first terminal of the capacitor is coupled to the first terminal of the fourth resistor; and a second terminal of the capacitor is grounded;

a first terminal of the fifth resistor is coupled to the first terminal of the fourth resistor, and a second terminal of the fifth resistor is coupled to a control signal output terminal of the controller for outputting the target control signal; and a first terminal of the sixth resistor is coupled to the second terminal of the fifth resistor; and a second terminal of the sixth resistor is coupled to a fixed voltage.

5. The voltage control circuit of claim 4, wherein the controller comprises an analog to digital converter configured to acquire the power supply voltage at the power supply terminal and convert the acquired power supply voltage from an analog signal to a digital signal.

6. The voltage control circuit of claim 5, wherein the power supply module comprises a DC-DC voltage regulator and an inductor coupled between the DC-DC voltage regulator and the power supply terminal.

7. The voltage control circuit of claim 1, wherein the controller is configured to determine whether the acquired power supply voltage value deviates from the target power supply voltage value by determining whether the acquired power supply voltage value is equal to the target power supply voltage value.

8. The voltage control circuit of claim 1, wherein the controller is configured to determine whether the acquired power supply voltage value deviates from the target power supply voltage value by determining whether a difference between the acquired power supply voltage value and the target power supply voltage value is within a threshold range.

9. A voltage control method, comprising:
   acquiring, by a controller, a power supply voltage value at a power supply terminal;
   determining, by the controller, whether the acquired power supply voltage value deviates from a target power supply voltage value;
   in response to the acquired power supply voltage value deviating from the target power supply voltage value, determining, by the controller, a target control signal associated with the target power supply voltage value;
   providing, by the controller, the target control signal to a voltage adjustment circuit; and
   adjusting, by the voltage adjustment circuit, the power supply voltage value at the power supply terminal to the target power supply voltage value according to the target control signal.

10. The voltage control method 9, wherein the target control signal is a PWM signal; and
   determining the target control signal associated with the target power supply voltage value comprises: determining a target PWM signal associated with the target power supply voltage value according to an association relationship between the power supply voltage value and the PWM signal.

11. The voltage control method of claim 10, further comprising: determining the association relationship between the power supply voltage value and the PWM signal based on the voltage adjustment circuit.

12. The voltage control method of claim 11, wherein
   determining the association relationship between the power supply voltage value and the PWM signal based on the voltage adjustment circuit comprises: determining an association relationship between the power supply voltage value and a PWM-signal duty cycle based on the voltage adjustment circuit; and
   determining the target PWM signal associated with the target power supply voltage value according to the association relationship between the power supply voltage value and the PWM signal comprises:
      determining a target PWM-signal duty cycle associated with the target power supply voltage value according to the determined association relationship between the power supply voltage value and the PWM-signal duty cycle; and
      generating the target PWM signal based on the target PWM-signal duty cycle.

13. The voltage control method of claim 9, wherein determining whether the acquired power supply voltage value deviates from the target power supply voltage value comprises determining whether the acquired power supply voltage value is equal to the target power supply voltage value.

14. The voltage control method of claim 9, wherein determining whether the acquired power supply voltage value deviates from the target power supply voltage value comprises determining whether a difference between the acquired power supply voltage value and the target power supply voltage value is within a threshold range.

15. A computer readable storage medium having a computer program stored thereon, wherein when the computer program is executed by a controller, the method of claim 9 is implemented.

* * * * *